(12) United States Patent
Bleckmann et al.

(10) Patent No.: US 9,704,659 B2
(45) Date of Patent: Jul. 11, 2017

(54) DEVICE FOR OPERATING MULTIPLE FUNCTIONS IN A MOTOR VEHICLE

(71) Applicant: Leopold Kostal GmbH & Co. KG, Luedenscheid (DE)

(72) Inventors: Michael Bleckmann, Schwerte-Ergste (DE); Corinna Machatzke, Schalksmuehle (DE)

(73) Assignee: Leopold Kostal GmbH & Co. KG, Luedenscheid (DE)

( * ) Notice: Subject to any disclaimer, the term of this patent is extended or adjusted under 35 U.S.C. 154(b) by 65 days.

(21) Appl. No.: 14/880,544

(22) Filed: Oct. 12, 2015

(65) Prior Publication Data

US 2016/0035503 A1 Feb. 4, 2016

Related U.S. Application Data

(63) Continuation of application No. PCT/EP2014/057322, filed on Apr. 10, 2014.

(30) Foreign Application Priority Data

Apr. 13, 2013 (DE) .......................... 10 2013 006 415

(51) Int. Cl.
*H01H 9/00* (2006.01)
*H01H 3/02* (2006.01)
(Continued)

(52) U.S. Cl.
CPC .......... *H01H 3/0213* (2013.01); *H01H 3/122* (2013.01); *H01H 23/24* (2013.01);
(Continued)

(58) Field of Classification Search
CPC ...... H01H 3/0213; H01H 25/06; H01H 23/24; H01H 3/122; H03K 17/9622
(Continued)

(56) References Cited

U.S. PATENT DOCUMENTS 5,387,261 A 2/1995 Yamada et al.
7,860,538 B2 * 12/2010 Won ....................... G06F 3/0338
200/18

(Continued)

FOREIGN PATENT DOCUMENTS

DE 102009032634 A1 1/2011
DE 102010024776 A1 12/2011
(Continued)

OTHER PUBLICATIONS

European Patent Office, International Search Report for International Application No. PCT/EP2014/057322 mailed Jul. 8, 2014.
(Continued)

*Primary Examiner* — Renee Luebke
*Assistant Examiner* — Lheiren Mae A Caroc
(74) *Attorney, Agent, or Firm* — Brooks Kushman P.C.

(57) ABSTRACT

A device for operating multiple functions includes an operating element and a base. The base has side bearings and pins. The operating element has rotational axle end sections mounted in guide slots of the side bearings, respectively, to pivotably be mounted to the base about an axis of rotation to thereby be movable between at least two positions. At least one of the positions is assigned to a switching function. The operating element is further mounted to the base on a centered bearing between the side bearings of the base, and the operating element is supported on the pins of the base.

18 Claims, 3 Drawing Sheets

(51) Int. Cl.
  *H01H 3/12* (2006.01)
  *H01H 23/24* (2006.01)
  *H01H 25/06* (2006.01)
  *H03K 17/96* (2006.01)

(52) U.S. Cl.
  CPC ......... *H01H 25/06* (2013.01); *H03K 17/9622* (2013.01); *B60K 2350/1036* (2013.01); *H01H 2221/058* (2013.01); *H03K 2217/960755* (2013.01)

(58) Field of Classification Search
  USPC ........................................ 200/341, 343, 345
  See application file for complete search history.

(56) References Cited

U.S. PATENT DOCUMENTS

2009/0301852 A1  12/2009  Keist et al.
2012/0199459 A1   8/2012  Reise

FOREIGN PATENT DOCUMENTS

| EP | 2509087 A1 | 10/2012 |
| WO | 2007053966 A2 | 5/2007 |
| WO | 2010094984 A1 | 8/2010 |
| WO | 2014167075 A1 | 10/2014 |
| WO | 2014167076 A1 | 10/2014 |

OTHER PUBLICATIONS

The International Bureau of WIPO, International Preliminary Report on Patentability for International Application No. PCT/EP2014/057322 issued Oct. 13, 2015.

\* cited by examiner

DEVICE FOR OPERATING MULTIPLE FUNCTIONS IN A MOTOR VEHICLE

CROSS-REFERENCE TO RELATED APPLICATIONS

This application is a continuation of International Application No. PCT/EP2014/057322, published in German, with an International filing date of Apr. 10, 2014, which claims priority to DE 10 2013 006 415.5, filed Apr. 13, 2013; the disclosures of which are hereby incorporated in their entirety by reference herein.

TECHNICAL FIELD

The present invention relates to a device for operating multiple functions in a motor vehicle, the device having an operating element pivotably mounted about an axis of rotation to be thereby movable between at least two positions with at least one of the positions being associated with a switching function.

BACKGROUND

DE 10 2010 024 776 A1 describes a device having an operating element pivotably mounted about an axis of rotation. The operating element can be in the form of a switching strip having capacitive sensor surfaces. Switching components or switch contacts can be actuated with the switching strip being swiveled to thereby cause switching functions to trigger. The triggered switching functions correspond to the actuated switching components or switch contacts.

DE 10 2010 024 776 A1 thereby describes the functional principle of a device which combines touch sensitive and pressure actuatable contact switching elements. Toggle switches are suggested as switching elements. The actuation of toggle switches requires a clearly discernable haptic path of actuation even more exaggerated than a lever-type operating element. Such a larger path of actuation is not desirable in every situation.

SUMMARY

An object includes a device for operating multiple functions in which the device has a simple, cost-effective mechanical design that is stable, and in which an operating element of the device is mounted free of play and is tolerance insensitive and detects tensile and/or pressure (i.e., compression) actuations with only a small actuator travel.

In carrying out at least one of the above and/or other objects, a device for operating multiple functions is provided. The device includes an operating element and a base. The base has side bearings and pins. The operating element has rotational axle end sections mounted in guide slots of the side bearings, respectively, to pivotably be mounted to the base about an axis of rotation to thereby be movable between at least two positions. At least one of the positions is assigned to a switching function. The operating element is further mounted to the base on a centered bearing between the side bearings of the base. The operating element is supported on the pins of the base.

The operating element may further include a force sensor disposed between the operating element and one of the pins of the base. The force sensor detects pressure forces pressing the operating element toward the base as the pressure forces cause the force sensor to press more against the one of the pins. The force sensor detects tensile forces pulling the operating element away from the base as the tensile forces cause the force sensor to press less against the one of the pins. The operating element may further include a receptacle. The force sensor is disposed between the receptacle and an end section of the one of the pins. The device may further include a compression spring configured to pretension the operating element against the force sensor. The force sensor may be disk-shaped, function according to a capacitive principle, and/or function according to a piezoelectric principle.

The base and the operating element may each further include a respective centering wall section. The centering wall sections form the centered bearing.

The mounting of the operating element to the base on the centered bearing may limit mobility of the operating element relative to the base in a vertical direction perpendicular to the axis of rotation.

The operating element may further include a surface opening and the base plate may further include a centering element. The centering element extends through the surface opening to thereby limit movability of the operating element in a direction parallel to the axis of rotation.

The operating element may form a switching strip having touch-sensitive capacitive sensor surfaces that trigger different functions through a manual actuation.

The operating element may further include touch-sensitive capacitive sensor surfaces that trigger different functions through a manual actuation.

Further, in carrying out at least one of the above and/or other objects, a device for operating multiple functions in a vehicle is provided. The device includes an operating element and a base. The base has two side bearings and two side pins. The side bearings have guide slots extending along a vertical axis. The operating element is spaced apart from the base along a vertical axis. The operating element has rotational axle end sections floatingly mounted in the guide slots of the side bearings, respectively, to pivotably be mounted to the base about an axis of rotation, perpendicular to the vertical axis, to thereby be movable between at least two positions. At least one of the positions is assigned to a switching function. The operating element is further mounted over the base in a centered manner relative to the vertical axis on a centered bearing between the side bearings of the base. The operating element is floatingly supported on the side pins of the base.

An embodiment includes a device for operating multiple functions in a vehicle. The device includes an operating element and a base. The operating element and the base are spaced apart from one another along a vertical axis. The operating element is pivotably mounted to the base about an axis of rotation, perpendicular to the vertical axis, and can thereby be moved between at least two positions. At least one of the positions is associated with a switching function. The operating element includes first and second rotational axle end sections. The base includes first and second laterally spaced apart side bearings. Each side bearing includes an elongated hole oriented along the vertical axis. The rotational axle end sections are mounted in the elongated holes of the side bearings, respectively, to pivotably mount the operating element to the base. The operating element is further mounted over the base in a centered manner at a central mounting point relative to the direction of the vertical axis. The base further includes two laterally spaced apart pins. The operating element is supported over the base on the two pins.

The combination of mounting the operating element on the two pins of the base in a floating manner, mounting the operating element in a vertically centered manner to the base, and rotatably mounting the operating element to the base in a floating manner on two vertically extending holes produces a mounting of the operating element that is clearly but not overly defined.

In embodiments, the rotational axle end sections of the operating element are mounted in two guide slots (i.e., the two elongated holes) respectively of two side bearings arranged along a vertical axis, the operating element is mounted centered on a central bearing point with respect to the direction of the vertical axis, and the operating element is supported on two pins extending along the vertical axis. As indicated, the combination of a floating mounting of the operating element on the pins, a vertically centered mounting of the operating element, and a floating pivot mounting of the operating element at two vertical guide slots implements a mounting of the operating element that is uniquely determined but not over-determined.

In embodiments, at least one of the pins is supported on a force sensor. The use of a force sensor enables recognition of pressure actuations of the operating element over a relatively short path of actuation, which must not be sensed as a movement of the operating element. Due to the mounting of the operating element that is implemented, it is assured that the force sensor is not excessively pre-tensioned and driven beyond its range of measurement.

In embodiments, the force sensor is a disk-shaped sensor that functions according to a capacitive operating principle. Such a force sensor, for instance one having parallel condenser plates, can have relatively small dimensions, especially in the direction of actuation, and can detect forces over a short path of actuation. The force sensor can alternatively be a piezoelectric sensor.

In embodiments, two force sensors are respectively arranged on the end sections of two pins of the base. It is thereby possible to resolve the location of the actuated switching surfaces.

In embodiments, the operating element is pre-tensioned by spring force against the force sensor. By such means the force sensor can detect both compressive and tensile forces (i.e., both pushing and pulling forces) acting on the operating element and can thereby distinguish actuations of the operating element in two different directions.

In embodiments, the operating element has at least two touch-sensitive capacitive sensor surfaces. Different functions can be resolved through a manual actuation of the operating element depending on which actuation surface is touched. The operating element thereby contains a switching strip having neighboring capacitive sensor surfaces and an integrated circuit (e.g., a printed circuit board). The operating element can be designed essentially as a plastic strip, which can be pivotably arranged, and can thus be almost free of play and is not tolerance sensitive.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
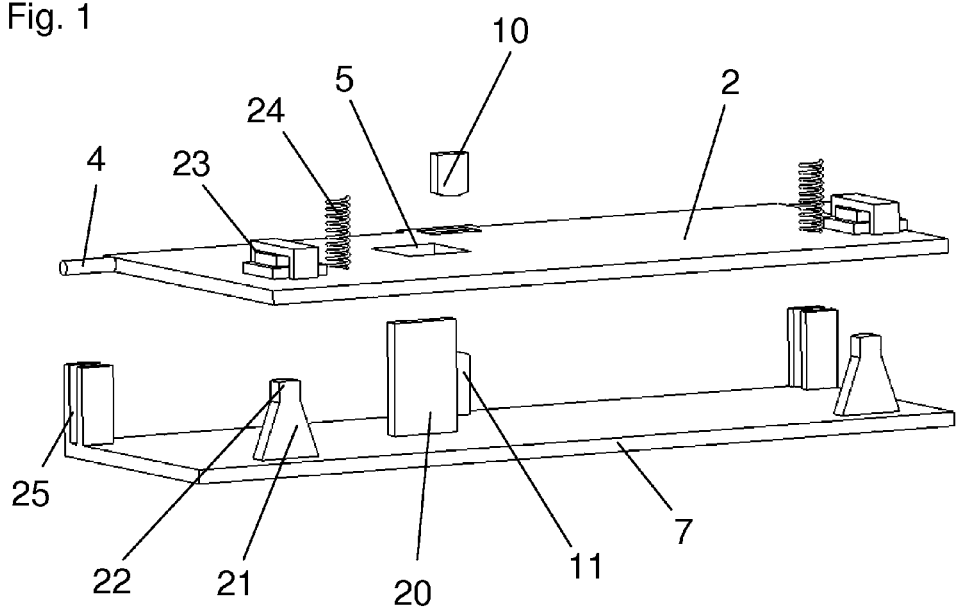
FIG. 1 illustrates an exploded view of a basic depiction of a device for operating multiple functions in accordance with embodiments of the present invention, the device being shown in a disassembled state.
Figure 2:
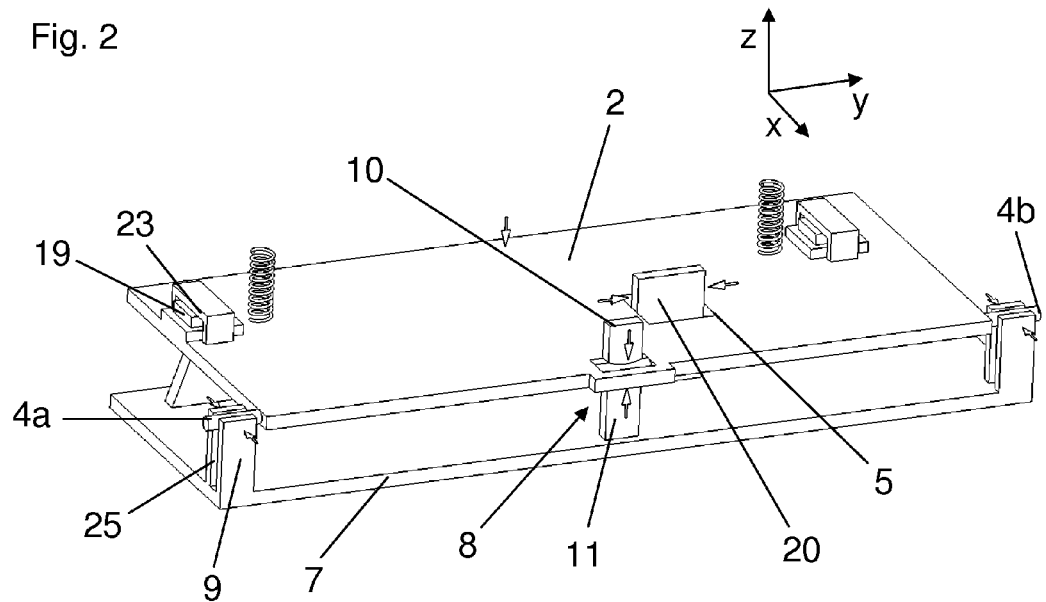
FIG. 2 illustrates a perspective view of the basic depiction of the device shown in FIG. 1, the device being shown in an assembled state.
Figure 3:
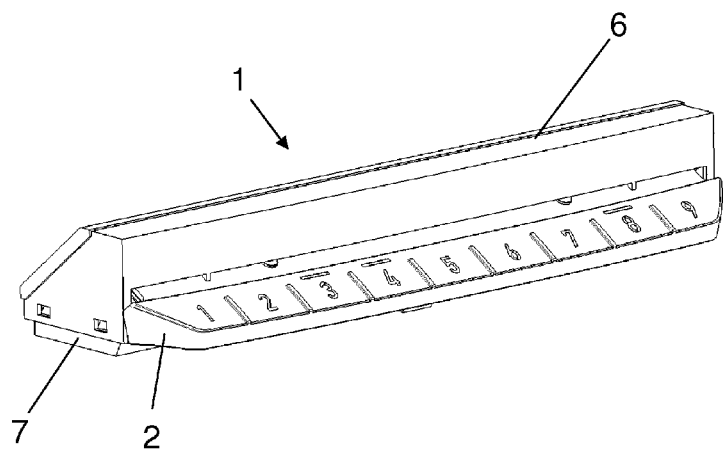
FIG. 3 illustrates a perspective view of an exemplary implementation of the device, the device being shown in an assembled state.
Figure 4:
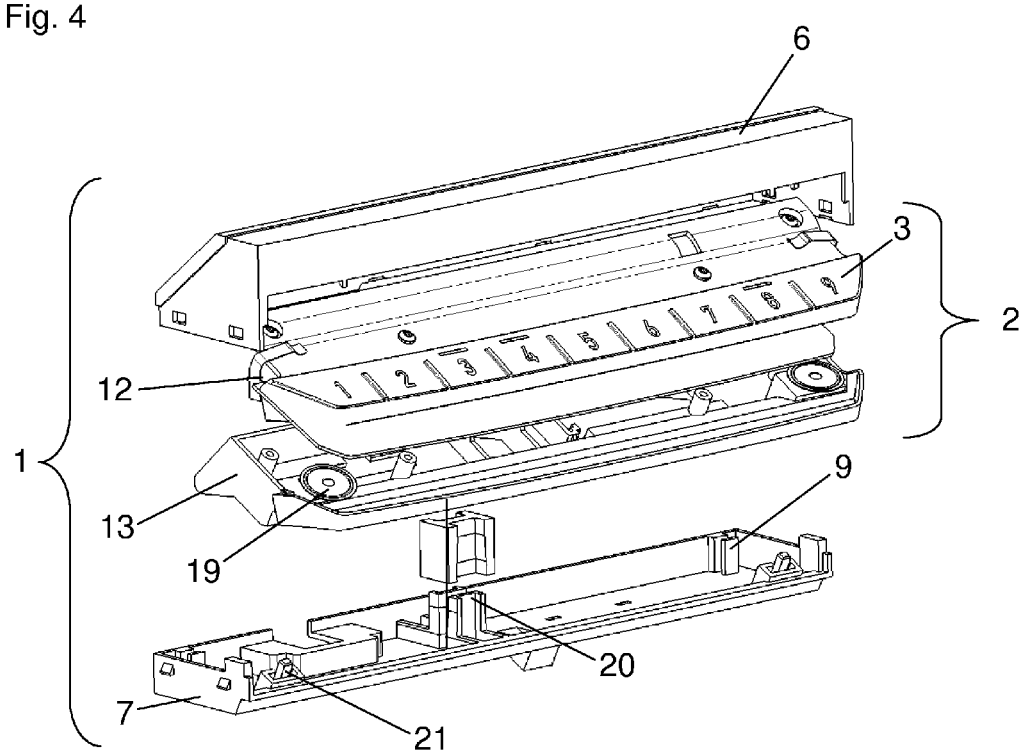
FIG. 4 illustrates an exploded view of the exemplary implementation of the device shown in FIG. 3, the device being shown in a disassembled state.
Figure 5:
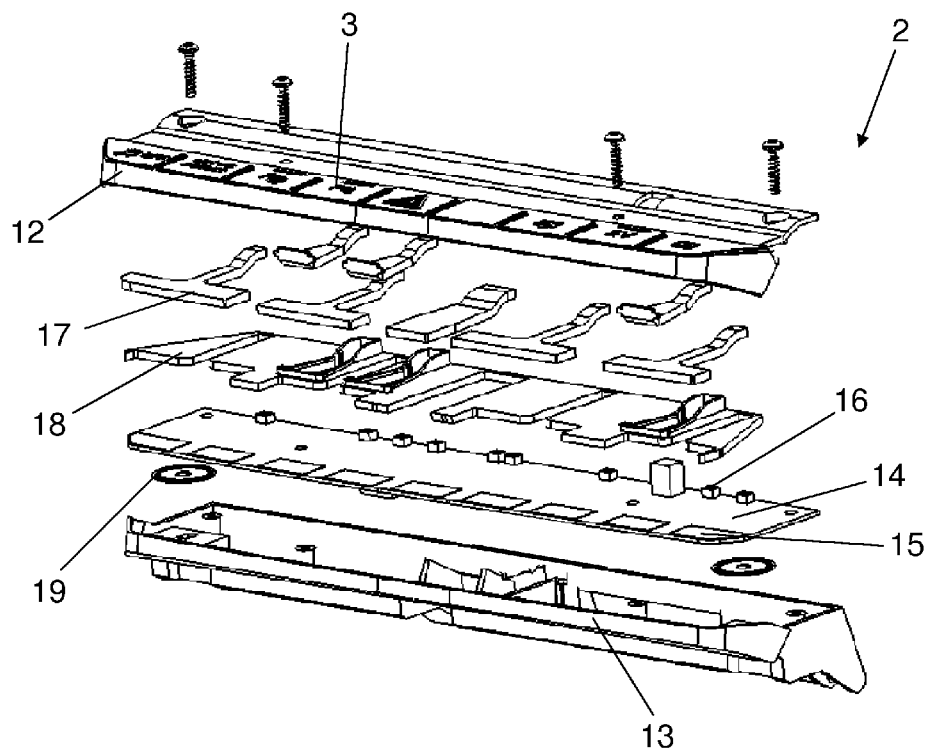
FIG. 5 illustrates an exploded view of the operating element of the exemplary implementation of the device shown in FIG. 3, the operating element being shown in a disassembled state.

FIGS. 1 and 2 illustrate views of a basic depiction of a device 1 for operating multiple functions. FIGS. 3, 4, and 5 illustrate views of an exemplary implementation of device 1. As follows, FIGS. 3, 4, and 5 will be described ahead of FIGS. 1 and 2 being described.

Referring now to FIGS. 3, 4, and 5, an exemplary implementation of a device 1 for operating multiple functions will be described. FIG. 3 illustrates device 1 in an assembled state whereas FIG. 4 illustrates device 1 in a disassembled state prior to assembly. FIG. 5 illustrates an operating element 2 of device 1 in which the operating element is shown in a disassembled state prior to assembly.

Device 1 includes operating element 2 and a base 7. Operating element 2 is located between base 7 and an upper housing part 6. As such, base 7 is a lower housing part. Upper housing part 6 may be a housing shell.

Lower housing part 7 has an integrally molded centering element 20, two integrally molded side bearings 9, and two pins 21 for operating element 2. End sections of pins 21 come into contact with respective force sensors 19 of operating element 2.

The internal layout of operating element 2 is shown in FIG. 5 in an exploded view. Operating element 2 includes a switching strip 12 and a switching strip support 13. Switching strip 12 includes a plurality of actuator (sensor) surfaces 3. Switching strip 12 is mounted on switching strip support 13. Operating element 2 further includes a printed circuit board (PCB) 14. PCB 14 is located between switching strip 12 and switching strip support 13. PCB 14 includes a series of capacitive sensor surfaces 15 placed thereon. Sensor surfaces 15 are respectively associated with actuator surface 3 on switching strip 12. PCB 14 further includes light sources 16 (e.g., LEDs) placed thereon. Operating element 2 further includes light conductors 17 and a visor body 18. Light from light sources 16 conducts over light conductors 17 and visor body 18 for illuminating symbolic displays on actuator surfaces 3.

Operating element 2 further includes one or more force sensors 19. Force sensors 19 are located underneath PCB 14. Force sensors 19 detect actuation forces (i.e., compressive and tensile forces) acting on operating element 2. Force sensors 19 may be disk-shaped and may operate according to a capacitive principle for detecting the actuation forces. In order to make a multiplicity of operating functions selectable, triggerable operating functions can be pre-selected by touching corresponding actuating surfaces 3 arranged on switching strip 12. The pre-selected operating function is then confirmed and triggered by pressure actuation of operating element 2.

Referring now to FIGS. 1 and 2, with continual reference to FIGS. 3, 4, and 5, a basic version of device 1 will be described. The design and manner of operation of device 1, and in particular the detection of an actuation force through force sensor 19, will be explained in greater detail in the following with the aid of FIGS. 1 and 2 in generalized schematic illustrations. In FIGS. 1 and 2, operating element 2 is simplified as an operating bar 2, on which the electrical and electronic components have been eliminated in order to clarify the mechanism, and lower housing part 7 is simplified as a base plate 7. In order to make a simple comparison between the exemplary implementation of device 1 shown in FIGS. 3, 4, and 5 and the basic version of device 1 shown in FIGS. 1 and 2, the same reference numbers are used in all figures for the components that correspond to one another.

FIGS. 1 and 2 illustrate the positioning of operating bar 2 on base plate 7, which complies with the principle of the positioning of operating element 2 on lower housing part 7 in the exemplary implementation of device 1 shown in FIGS. 3, 4, and 5. Operating bar 2 is pivotably mounted about an axis of rotation 4 on base plate 7. For this purpose, pin-shaped rotational axle end sections 4a, 4b of operating bar 2 are movably guided in vertical guide slots 25 of respective side bearings 9 of base plate 7. As a result of the mounting of rotational axle end sections 4a, 4b of operating bar 2 to respective side bearings 9 of base plate 7, the position of operating bar 2 is determined with respect to the x-direction (of the x, y, z coordinate axes shown in FIG. 2).

Base plate 7 further includes a center bearing 8 located between guide slots 25 of side bearings 9. Centering wall sections 10, 11 tightly surround upper and lower sides of operating bar 2 on center bearing 8. Centering wall sections 10, 11 are oriented along vertical axis z. Centering wall sections 10, 11 are respectively formed by segments of housing parts 6, 7 or with housing parts 6, 7 and limit the mobility of operating element 2 in the vertical direction.

Operating bar 2 includes an opening 5 through its surface. Base plate 7 includes a centering element 20. Centering element 20 of base plate 7 extends through opening 5 of operating bar 2 and thereby limits the movability of operating bar 2 in the y-direction (of the x, y, z coordinate axes shown in FIG. 2).

In order to enable a pivoting motion of operating bar 2, and to exclude tilting of operating bar 2 about a tilting axis perpendicular to axis of rotation 4, operating bar 2 is floatedly supported on the two pins 21 of base plate 7. Free end sections 22 of pins 21 are supported respectively in receptacles 23 formed on the surface of operating bar 2. Force sensors 19 are respectively disposed between pins 21 and bearing (contact) surfaces of receptacles 23.

Force sensors 19 detect pressure forces acting on the surface of operating bar 2. Force sensors 19 detect the pressure forces as the pressure forces cause force sensors 19 to press against end sections 22 of pins 21.

Force sensors 19 also detect tensile forces that originate from operating bar 2 being lifted. One or more springs are provided for this purpose, which are shown schematically as two compression springs 24. Compression springs 24 provide a biasing force against operating bar 2 toward base plate 7 and thereby press force sensors 19 against the front surfaces of end sections 22 of pins 21. The pretension produced through compression springs 24 reduces the bearing play in operating bar 2.

Force sensors 19 also detect the rest position of operating bar 2 through this mechanical pretension. The tension is increased when a compression pressure force is applied to operating bar 2 and reduced when a tensile force is applied to operating bar 2. Pivoting actions of operating bar 2 can thereby be detected both downwardly (i.e., pushing) and upwardly (i.e., pulling), even without a form-fitting connection, by force sensor 19.

When a prescribed positive or negative force change threshhold is exceeded, an electronic unit (not shown) triggers an operating function that corresponds to the actuation.

REFERENCE SYMBOLS 1 device
2 operating element (operating bar)
3 actuator (sensor) surfaces
4 axis of rotation
4a, 4b first and second rotational axle end sections
5 opening
6 upper housing part (housing shell)
7 lower housing part (base plate)
8 center bearing
9 side bearings
10, 11 centering wall sections
12 switching strip
13 switching strip support
14 printed circuit board
15 sensors
16 light sources
17 light conductor
18 visor body
19 force sensor(s)
20 centering element
21 pins
22 end sections
23 receptacles
24 compression spring(s)
25 guide slots
x, y, z coordinate axes (directions)
x axis direction (perpendicular to axis of rotation and vertical axis)
y axis direction (parallel with axis of rotation)
z vertical axis While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A device for operating multiple functions, the device comprising:
   a base having side bearings and pins;
   an operating element having rotational axle end sections mounted in guide slots of the side bearings, respectively, to pivotably be mounted to the base about an axis of rotation to thereby be movable between at least two positions, wherein at least one of the positions is assigned to a switching function;

wherein the operating element is further mounted to the base on a centered bearing between the side bearings of the base, and the operating element is supported on the pins of the base; and wherein the operating element futher includes a force sensor disposed between the operating element and one of the pins of the base, the force sensor detects pressure forces pressing the operating element toward the base as the pressure forces cause the force sensor to press more against the one of the pins, the force sensor detects tensile forces pulling the operating element away from the base as the tensile forces cause the force sensor to press less against the one of the pins.

2. The device of claim 1 wherein:
the operating element further includes a receptacle, wherein the force sensor is disposed between the receptacle and an end section of the one of the pins.

3. The device of claim 1 further comprising:
a compression spring configured to pre-tension the operating element against the force sensor.

4. The device of claim 1 wherein:
the force sensor is disk-shaped.

5. The device of claim 1 wherein:
the force sensor functions according to a capacitive principle.

6. The device of claim 1 wherein:
the force sensor functions according to a piezoelectric principle.

7. The device of claim 1 wherein:
the base and the operating element each further include a respective centering wall section which form the centered bearing.

8. The device of claim 1 wherein:
the mounting of the operating element to the base on the centered bearing limits mobility of the operating element relative to the base in a vertical direction perpendicular to the axis of rotation.

9. The device of claim 1 wherein:
the operating element includes a surface opening and the base plate includes a centering element, the centering element extending through the surface opening to thereby limit movability of the operating element in a direction parallel to the axis of rotation.

10. The device of claim 1 wherein:
the operating element forms a switching strip having a plurality of touch-sensitive capacitive sensor surfaces that trigger different functions through a manual actuation.

11. A device for operating multiple functions, the device comprising:
a base having side bearings and pins;
an operating element having rotational axle end sections mounted in guide slots of the side bearings, respectively, to pivotably be mounted to the base an axis of rotation to thereby be movable between at least two positions, wherein at least one of the positions is assigned to a switching function;
wherein the operating element is further mounted to the base on a centered bearing between the side bearings of the base, and the operating element is supported on the pins of the base; and wherein the operating element further includes a plurality of touch-sensitive capacitive sensor surfaces that trigger different functions through a manual actuation.

12. A device for operating multiple functions in a vehicle, the device comprising:
a base having two side bearings and two side pins, the side bearings having guide slots extending along a vertical axis;
an operating element spaced apart from the base along a vertical axis, the operating element having rotational axle end sections floatingly mounted in the guide slots of the side bearings, respectively, to pivotably be mounted to the base about an axis of rotation, perpendicular to the vertical axis, to thereby be movable between at least two positions, wherein at least one of the positions is assigned to a switching function;
wherein the operating element is further mounted over the base in a centered manner relative to the vertical axis on a centered bearing between the side bearings of the base, and the operating element is floatingly supported on the side pins of the base;
wherein the base and the operating element each further include a respective centering wall section which form the centered bearing.

13. The device of claim 12 wherein:
the operating element further includes force sensors respectively disposed between the operating element and the side pins of the base, the force sensors detect pressure forces pressing the operating element toward the base as the pressure forces cause the force sensors to press more against the side pins, the force sensors detects tensile forces pulling the operating element away from the base as the tensile forces cause the force sensors to press less against the side pins.

14. The device of claim 13 wherein:
the operating element further includes receptacles, wherein the force sensors are disposed between respective ones of the receptacles and end sections of the side pins.

15. The device of claim 13 further comprising:
compression springs configured to pre-tension the operating element against the force sensors.

16. The device of claim 12 wherein:
the mounting of the operating element to the base on the centered bearing limits mobility of the operating element relative to the base along the vertical axis.

17. The device of claim 12 wherein:
the operating element includes a surface opening and the base plate includes a centering element, the centering element extending through the surface opening to thereby limit movability of the operating element in a direction parallel to the axis of rotation.

18. The device of claim 12 wherein:
the operating element forms a switching strip having a plurality of touch-sensitive capacitive sensor surfaces that trigger different functions through a manual actuation.

* * * * *